(12) United States Patent
Naura et al.

(10) Patent No.: US 8,410,910 B2
(45) Date of Patent: Apr. 2, 2013

(54) PASSIVE CONTACTLESS INTEGRATED CIRCUIT COMPRISING A FLAG FOR MONITORING AN ERASE/PROGRAMMING VOLTAGE

(75) Inventors: David Naura, Aix en Provence (FR); Christophe Moreaux, Simiane (FR); Ahmed Kari, Aix en Provence (FR); Pierre Rizzo, Aix en Provence (FR)

(73) Assignee: STMicroelectronics SA, Montrouge (FR)

( * ) Notice: Subject to any disclaimer, the term of this patent is extended or adjusted under 35 U.S.C. 154(b) by 1020 days.

(21) Appl. No.: 12/043,691

(22) Filed: Mar. 6, 2008

(65) Prior Publication Data
US 2009/0066483 A1 Mar. 12, 2009

Related U.S. Application Data (63) Continuation-in-part of application No. PCT/FR2006/001985, filed on Aug. 25, 2006.

(30) Foreign Application Priority Data

Sep. 6, 2005 (FR) ..................................... 05 09081

(51) Int. Cl.
*H04Q 5/22* (2006.01)

(52) U.S. Cl. .................. 340/10.51; 340/10.1; 340/572.1
(58) Field of Classification Search ............... 340/10.51, 340/10.1, 572.1; 342/44; 235/380, 492
See application file for complete search history.

(56) References Cited

U.S. PATENT DOCUMENTS

| | | | |
|---|---|---|---|
| 5,394,105 A | 2/1995 | Axer | |
| 5,449,894 A | 9/1995 | Bruhnke et al. | |
| 5,521,590 A * | 5/1996 | Hanaoka et al. | ........... 340/10.51 |
| 5,712,630 A * | 1/1998 | Nanboku et al. | ............. 340/10.3 |
| 5,982,647 A | 11/1999 | Martin et al. | |
| 6,288,629 B1 | 9/2001 | Cofino et al. | |
| 6,437,609 B1 | 8/2002 | Chehadi | |
| 6,525,362 B2 * | 2/2003 | Sadayuki | ...................... 257/298 |
| 2005/0162145 A1 | 7/2005 | Smith et al. | |

* cited by examiner

*Primary Examiner* — Edwin Holloway, III
(74) *Attorney, Agent, or Firm* — Allen, Dyer, Doppelt, Milbrath & Gilchrist, P.A.

(57) ABSTRACT

A passive contactless integrated circuit includes an electrically programmable non-volatile data memory (MEM), a charge accumulation booster circuit for supplying a high voltage necessary for writing data in the memory. The integrated circuit includes a volatile memory point for memorizing an indicator flag, and circuitry for modifying the value of the indicator flag when the high voltage reaches a critical threshold for the first time after activating the booster circuit.

25 Claims, 6 Drawing Sheets

PASSIVE CONTACTLESS INTEGRATED CIRCUIT COMPRISING A FLAG FOR MONITORING AN ERASE/PROGRAMMING VOLTAGE

TECHNICAL FIELD

The present disclosure generally relates to a contactless integrated circuit comprising a data memory and a charge accumulation booster circuit for supplying a high voltage necessary for writing data in the memory.

The present disclosure more particularly but not exclusively relates to a contactless integrated circuit of the passive type, electrically powered by a voltage produced from an antenna signal.

BACKGROUND INFORMATION

Passive contactless integrated circuits are usually used in RFID (Radio Frequency Identification) applications and can be of the inductive coupling type or of the "electrical coupling" type.

The passive integrated circuits of the first (inductive coupling) type comprise an antenna coil, send data by load modulation and are powered by inductive coupling in presence of a magnetic field whose frequency is usually about 10 MHz. These integrated circuits are for example described by the standards ISO/IEC 14443A/B, ISO/IEC 13693 which provide a working frequency of 13.56 MHz.

The passive integrated circuits of the second (electrical coupling) type are electrically powered by a UHF electric field oscillating at several hundreds of MHz, and send data by modulating the reflection rate of their antenna circuit (this technique is called "backscattering"). These integrated circuits are for example described by the industrial specification EPCTM-GEN2 ("Radio-Frequency Identity Protocols Class-1 Generation-2—UHF RFID Protocol for Communications at 860 MHz-960 MHz") in the course of standardization. They are generally used in long range applications, wherein the distance between the integrated circuit and a station for sending/receiving data emitting the electric field, commonly called a "reader", can reach several meters.

Figure 1:
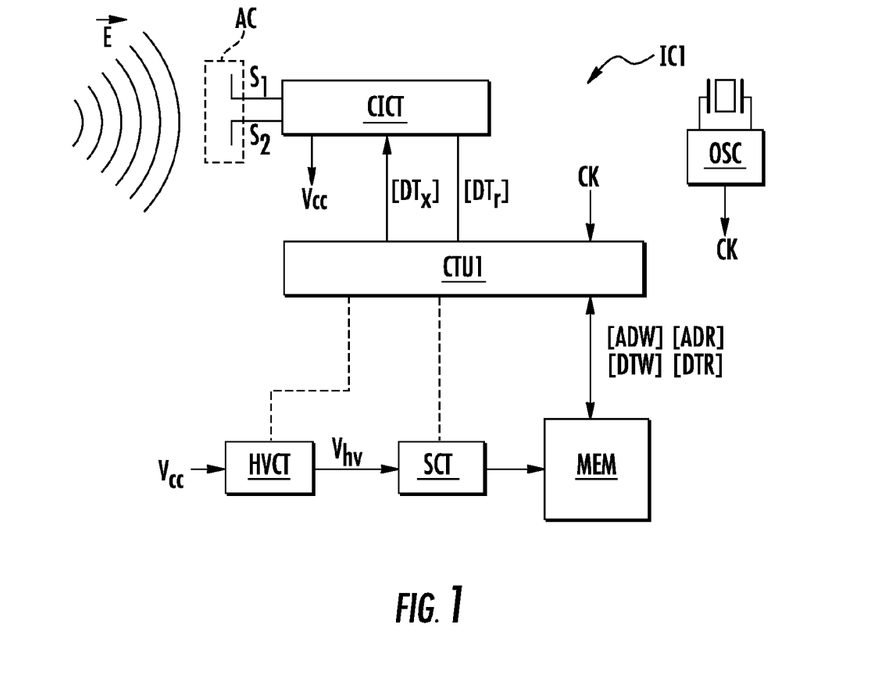
FIG. 1 previously described schematically shows the architecture of a contactless integrated circuit comprising a non-volatile memory.

FIG. 1 schematically shows the architecture of an integrated circuit IC1 of the second type. The integrated circuit comprises a dipole antenna circuit AC, a communication interface circuit CICT, a control unit CTU1, a non-volatile memory MEM of the EEPROM type (electrically erasable and programmable memory), a charge accumulation booster circuit HVCT and an oscillator OSC supplying a clock signal CK to the unit CTU1.

The circuit CICT ensures the reception and transmission of data via the antenna circuit. It receives from the control unit CTU1 data DTx to be sent via the antenna circuit or supplies to the unit CTU1 data DTr received via the antenna circuit. It also supplies a voltage Vcc ensuring the power supply of the integrated circuit and generated from antenna signals S1, S2 appearing in the antenna circuit AC in presence of an electric field E emitted by a reader (not shown). The voltage Vcc is typically of about one Volt to a few Volts.

The booster circuit HVCT supplies, from the voltage Vcc, a high voltage Vhv necessary for operations of writing data in the memory, typically about 10 to 15 V. The voltage Vhv is usually applied to the memory through a switch circuit SCT which is controlled by the unit CTU1.

When a write command is received, the unit CTU1 activates the booster circuit HVCT, applies to the memory MEM a write address ADW and data to be written DTW, and activates the switch circuit SCT so that a voltage pulse Vpp is applied to the memory. These operations can be repeated several times according to the number of write cycles to be performed, while leaving the booster circuit activated.

A drawback of this integrated circuit, inherent to its passive nature, is that the supply voltage Vcc can have critical attenuations caused by variations of the intensity of the electric field E from which it is extracted. There is a similar drawback on passive integrated circuits of the inductive coupling type, when the intensity of the magnetic field and/or the rate of inductive coupling with the reader are insufficient. These attenuations occur for example when the user of the integrated circuit, for example the holder of a contactless chip card comprising the integrated circuit, moves the card/the integrated circuit away from the reader during a communication between the reader and the integrated circuit. These attenuations of the supply voltage are problematic when they occur during the writing of data in the memory, because they can affect the high voltage Vhv. Thus, if the voltage Vhv has an insufficient level when the integrated circuit triggers the writing of the memory, memory cells might not store the data expected or might be set in an intermediary state which is neither the programmed state nor the erased state, corresponding to a corruption of data stored in the memory cells.

The U.S. Pat. No. 6,288,629 suggests to monitor the supply voltage Vcc when data are written in the memory, and to raise an indicator flag when the voltage Vcc varies below a critical threshold during the write phase. When the write phase ends, the integrated circuit reads the flag and, if the flag indicates that the voltage Vcc has become lower than the critical threshold during the writing phase, the integrated circuit communicates this information to the reader which has emitted the write command.

According to studies carried out by the present inventors, including various simulations aiming at observing the behavior of a contactless integrated circuit in operating conditions corresponding to concrete applications, this method can lead to diagnose that a write operation is faulty whereas it has developed properly. Indeed it turns out that, in various operating conditions, the supply voltage Vcc can have attenuations, or even short micro disconnections, which do not affect the writing process.

BRIEF SUMMARY

Thus, one embodiment improves the diagnosis of a faulty write operation, so that a write operation which has properly developed is not considered as faulty on the only ground that the supply voltage Vcc has been below a certain threshold during its variations.

One embodiment is based on the statement that, in most situations and operating conditions, a write operation can be validly carried out when the booster circuit has accumulated enough electric charges to allow it to bring this write operation off. According to an embodiment, this condition is satisfied when the high voltage Vhv supplied by the booster circuit has reached a threshold called "critical". Thus, according to an embodiment, an indicator flag is provided which, instead of depending on the supply voltage, depends on the value of the high voltage supplied by the booster circuit. This indicator flag can be used to post-diagnose a write operation, but has also a variety of other uses, shown below.

More particularly, one embodiment provides a passive contactless integrated circuit comprising an electrically programmable non-volatile data memory, a charge accumulation booster circuit for supplying a high voltage necessary to write data in the memory, a volatile memory point for memorizing an indicator flag, and means for modifying the value of the indicator flag when the high voltage reaches a critical threshold for the first time after activating the booster circuit.

According to one embodiment, the integrated circuit comprises a switch circuit for applying the high voltage to the memory and means for preventing the switch circuit from applying the high voltage to the memory as long as the high voltage has not reached the critical threshold after activating the booster circuit.

According to one embodiment, the switch circuit comprises a ramp generator for progressively supplying the high voltage to the memory.

According to one embodiment, the integrated circuit comprises a control unit configured for executing a command for writing a datum in the memory and then sending a specific message of information when the flag indicates that the high voltage has not reached the critical threshold during the execution of the write command.

According to one embodiment, the integrated circuit comprises a control unit configured for unconditionally performing the following actions, in response to a command for writing a datum in the memory: applying an activation signal to the booster circuit so that it produces the high voltage, applying to the memory a write address and a datum to be written, and applying an activation signal to a switch circuit supplying the high voltage to the memory.

According to one embodiment, the integrated circuit comprises a control unit configured for performing the following actions, upon reception of a command for writing a datum in the memory: applying an activation signal to the booster circuit, so that it produces the high voltage, applying to the memory a write address and the datum to be written, if the high voltage reaches the critical threshold, applying an activation signal to a switch circuit supplying the high voltage to the memory, and if the high voltage has not reached the critical threshold at the end of a determined period of time, not applying the activation signal to the switch circuit and sending a specific message of information indicating that the high voltage has not been applied to the memory.

According to one embodiment, the integrated circuit comprises a detection circuit which monitors the high voltage and supplies a detection signal whose value indicates if the high voltage is lower than the critical threshold or is superior or equal to the critical threshold.

According to one embodiment, the integrated circuit comprises a regulator circuit supplying a regulation signal of the booster circuit having an active value each time the high voltage is superior or equal to a regulation threshold.

According to one embodiment, the critical threshold is equal to the regulation threshold.

According to one embodiment, the regulation signal and the detection signal are the same.

According to one embodiment, the indicator flag is memorized by a flip-flop comprising a first control input for giving the flag a first value meaning that the high voltage has reached the critical threshold, and a second control input for giving the flag a second value meaning that the high voltage has not reached the critical threshold.

According to one embodiment, the first control input of the flip-flop receives the detection signal.

According to one embodiment, the second input of the flip-flop receives at least one of the two following signals: a signal for deactivating the booster circuit and/or a signal for resetting the integrated circuit.

One embodiment also relates to a portable electronic object of the type chip card or electronic tag, comprising a portable support and an integrated circuit according to an embodiment mounted onto the portable support or integrated into the portable support.

One embodiment also relates to a method for writing a datum in an electrically programmable non-volatile memory of a passive contactless integrated circuit, comprising: initializing an indicator flag in a volatile memory point of the integrated circuit, activating a charge accumulation booster circuit supplying a high voltage necessary for writing the datum in the memory, and changing the value of the indicator flag when the high voltage reaches a critical threshold for the first time after activating the booster circuit.

According to one embodiment, the high voltage is not applied to the memory as long as it does not reach the critical threshold.

According to one embodiment, the method comprises the unconditional execution of predefined stages aiming at writing the datum in the memory, and then sending a message of information concerning the value of the indicator flag if the flag indicates that the high voltage has not reached the critical threshold during the execution of the predefined stages.

According to one embodiment, the method comprises regulating the high voltage around a regulation threshold.

According to one embodiment, the critical threshold is equal to the regulation threshold.

According to one embodiment, the indicator flag is managed by a flip-flop comprising a control input to which a detection signal is applied which value indicates whether the high voltage is inferior to the critical threshold or is superior or equal to the critical threshold.

According to one embodiment, the flip-flop is reset when the booster circuit is not active.

BRIEF DESCRIPTION OF THE SEVERAL VIEWS OF THE DRAWINGS

These and other features will be presented in greater detail in the following description of one or more embodiments of a passive contactless integrated circuit, given in relation with, but not limited to the following figures.

DETAILED DESCRIPTION

In the following description, numerous specific details are given to provide a thorough understanding of embodiments.

The embodiments can be practiced without one or more of the specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

Figure 2:
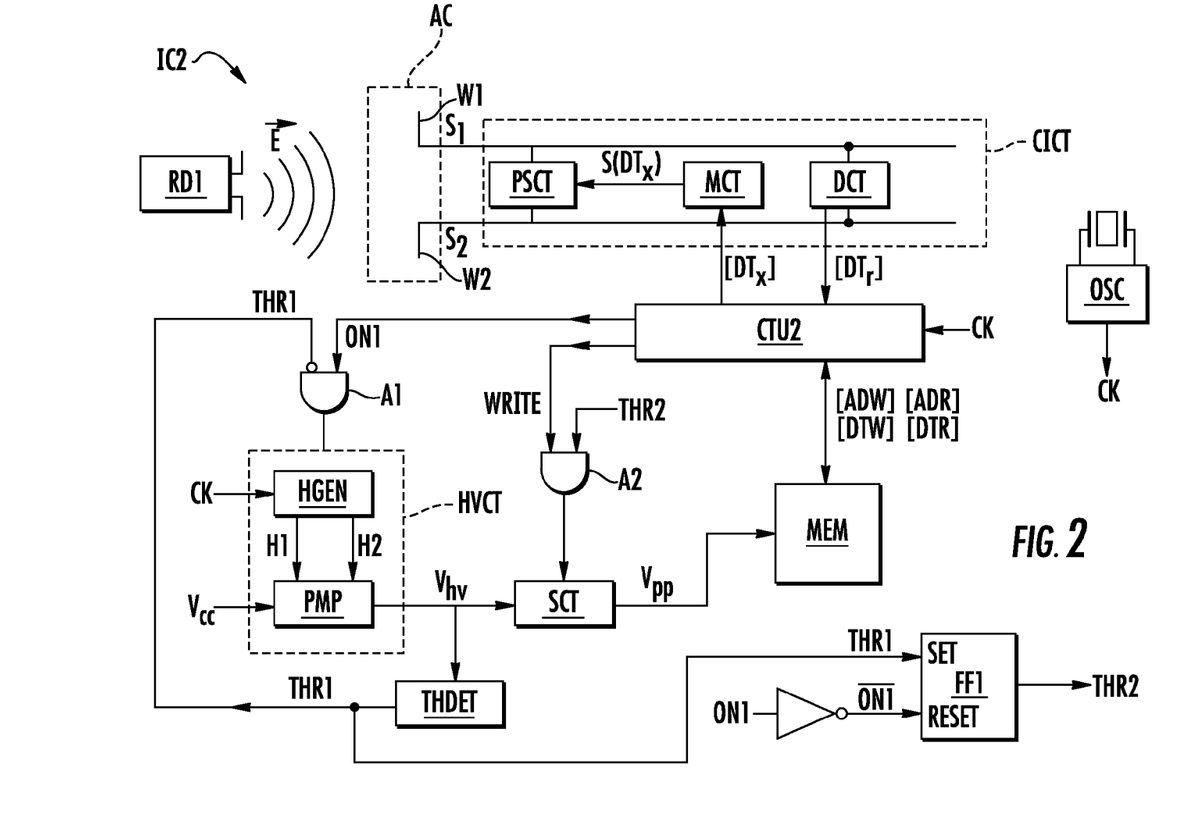
FIG. 2 shows the architecture of a contactless integrated circuit according to one embodiment, comprising a non-volatile memory and means for diagnosing a fault in the process of writing in the memory.

The integrated circuit IC2 shown in FIG. 2 comprises an antenna circuit AC, a communication interface circuit CICT, a control unit CTU2, a memory MEM of the EEPROM type (electrically erasable and programmable), a booster circuit HVCT and an oscillator OSC supplying a clock signal CK to the unit CTU2.

The antenna circuit here comprises two wires W1, W2 forming a dipole. In presence of an electric field E emitted by a reader RD1 schematically shown, alternating antenna signals S1, S2 of low amplitude (a few tenths of Volts) appear on the wires W1, W2.

The circuit CICT comprises a power supply circuit PSCT, a modulation circuit MCT and a demodulation circuit DCT. The circuit PSCT supplies a voltage Vcc ensuring the power supply of the integrated circuit. The voltage Vcc is produced from the antenna signals S1, S2 (or one of the antenna signals S1, S2 if one of the wires W1, W2 is linked to the ground). The circuit PSCT is for example a primary charge pump which uses the alternating signals S1, S2 as pump signals. The voltage Vcc is typically about one Volt to a few Volts, the most recent technologies in microelectronics make it possible to construct integrated circuits of small dimensions, implanted on a silicon chip with a surface inferior to one $mm^2$ and operating with a supply voltage of about 1.8 V.

The modulation circuit MCT receives from the control unit CTU2 data DTx to be sent, usually in coded form, and modulates the impedance of the antenna circuit AC according to these data, here by applying to the circuit PSCT an impedance modulation signal S(DTx) which effect is to short-circuit stages of the primary charge pump.

The circuit DCT demodulates the signals S1, S2 and supplies to the unit CTU2 data DTr conveyed by these signals. These data are sent by the reader RD1 by modulation of the electric field E, for example a modulation of the amplitude of the electric field.

The booster circuit HVCT here comprises a charge pump PMP and a circuit HGEN ensuring the excitation of the charge pump. The circuit HGEN supplies to the charge pump two low-frequency pump signals H1, H2 in phase opposition, generated from the clock signal CK. The charge pump PMP supplies a high voltage Vhv, typically from 10 to 15 V, from the voltage Vcc (or directly from the antenna signals S1, S2). The voltage Vhv is applied to the memory MEM by means of a switch circuit SCT. The circuit SCT is here a ramp generator allowing the voltage Vhv to be progressively applied to the memory MEM during writing phases, to avoid damaging the memory cells. The high voltage supplied in the form of ramp at the output of the switch circuit SCT is called here Vpp.

The control unit CTU2 receives from the reader RD1, through the antenna circuit AC and the interface circuit CICT, commands for reading or writing in the memory MEM including a write address ADW or a read address ADR, the write commands further comprising data to be written DTW. It sends back messages that may contain data DTR read from the memory, particularly in response to a read command. The writing of a datum usually comprises the erasing of memory cells designated by the address received, corresponding to the writing of a "0" in the memory cells, and then the programming of the memory cells which are to receive a "1".

When a write command is received, the control unit CTU2 activates the circuit HGEN so that the charge pump PMP receives the pump signals H1, H2 and supplies the voltage Vhv. Then, the control unit CTU2 applies to the memory the write address ADW and the data to be written DTW, and activates the switch circuit SCT so that a voltage pulse Vpp is applied to the memory. Here, the control unit CTU2 activates the circuit HGEN by applying on a control input of this circuit a signal "ON1" equal to 1, and activates the switch circuit SCT by applying to a control input of this circuit a signal "WRITE" equal to 1.

According to one embodiment, the integrated circuit IC2 comprises a threshold detector circuit THDET which monitors the high voltage Vhv. The circuit THDET comprises an input connected to the output of the charge pump PMP, and an output which supplies a detection signal THR1. The signal THR1 is 0 by default when the high voltage Vhv is lower than a threshold Vc. When the voltage Vhv exceeds the threshold Vc, the circuit THDET sets the signal THR1 to 1.

According to one embodiment, the threshold Vc is a critical threshold from which the booster circuit HVCT is assumed to have accumulated enough electric charges to ensure an operation of writing in the memory MEM, even if there are attenuations or micro-disconnections of the supply voltage Vcc.

The integrated circuit IC2 also comprises a volatile memory point for memorizing an indicator flag THR2. This memory point is here a flip-flop FF1 which receives the signal THR1 on one input SET and which output supplies the flag THR2. After resetting the flip-flop FF1, the flag THR2 goes to 1 the first time that the signal THR1 goes to 1, then remains 1 until the next flip-flop reset. This reset is ensured by applying on one input RESET of the flip-flop a signal /ON1 supplied by an inverting gate receiving the signal ON1 on its input. Thus, when the signal ON1 is kept to 0 by the control unit CTU2 and that the booster circuit HVCT is deactivated, the flag THR2 is forced to 0. When the unit CTU2 sets the signal ON1 to 1 to activate the circuit HVCT, the value of the flag remains 0. When the voltage Vhv reaches the threshold Vc, the signal THR1 goes to 1 and the flag THR2 goes to 1.

According to an embodiment, the voltage Vhv is regulated around a regulation threshold which is here equal to the critical threshold Vc. This regulation is here ensured by inhibiting the circuit HGEN when the signal THR1 goes to 1, so that the pump signals H1, H2 are no longer supplied to the charge pump. The control input of the circuit HGEN is for example linked to the output of a gate A1 of the AND type which receives the signal ON1 on a non-inverting input and the signal THR1 on an inverting input. When the signal ON1 is equal to 1 and the signal THR1 is equal to 0 (Vhv<Vc), the gate A1 is transparent with regard to the signal ON1 and the circuit HGEN is activated. When the signal THR1 goes to 1 (Vhv≧Vc), the output of the gate A1 goes to 0 and the circuit HGEN is deactivated, so that the voltage Vhv decreases until the signal THR1 goes back to 0 (Vhv<Vc). Then, the voltage Vhv increases again and the signal THR1 goes to 1 again, and so forth, the voltage Vhv thus being regulated around the threshold Vc.

Thus, the detector circuit THDET advantageously forms, with the gate A1, a regulator of the high voltage Vhv, in addition to its function of detection of the threshold allowing the flag THR2 to be managed. This regulation of the booster circuit by inhibition of the circuit HGEN reduces the electrical consumption of the integrated circuit and is more advantageous than by clipping the high voltage Vhv without stopping the charge pump, implying the apparition of a leakage current in the regulator. In the same way, the inhibition of the signals H1, H2 could be considered without stopping the circuit HGEN, but it would consume current unnecessarily.

According to an embodiment, the switch circuit SCT cannot be triggered by the control unit CTU2 as long as the high voltage Vhv has not reached the critical threshold Vc at least once after activating the booster circuit HVCT. To that end, the control input of the switch circuit SCT is for example linked to the output of a gate A2 of the AND type receiving the signal WRITE on a first input and receiving the flag THR2 on a second input. When the signal WRITE is set to 1 by the control unit CTU2 to apply a voltage pulse Vpp to the memory, the gate A1 is not transparent with regard to the signal WRITE as long as the flag THR2 is not equal to 1.

Thus, if an attenuation of the supply voltage Vcc prevents the high voltage Vhv from increasing as expected and if it does not reach the threshold Vc when the control unit sets the signal WRITE to 1, the inhibition of the switch circuit SCT guarantees that the memory MEM is not going to receive a voltage Vpp with an insufficient level to write the data and which may cause a data corruption.

Figure 3A:
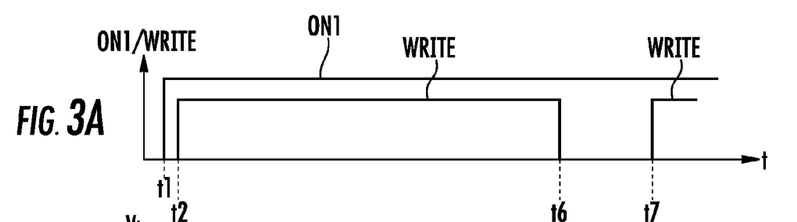
FIGS. 3A to 3E show various example electrical signals appearing in the circuit of FIG. 2 during the writing of data in the memory according to one embodiment.
Figure 3B:
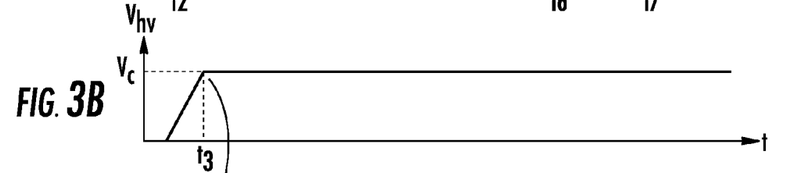
Figures 3C, 3D:
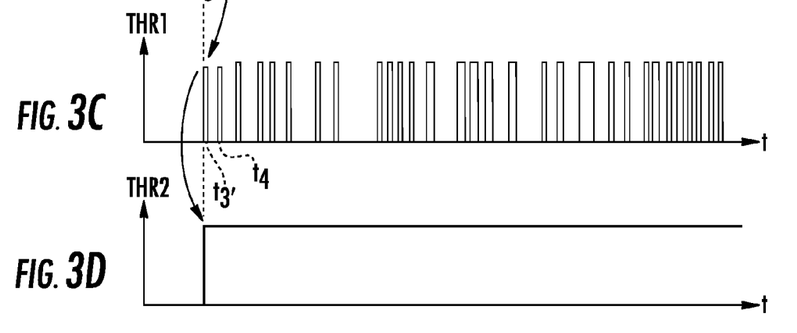
Figure 3E:
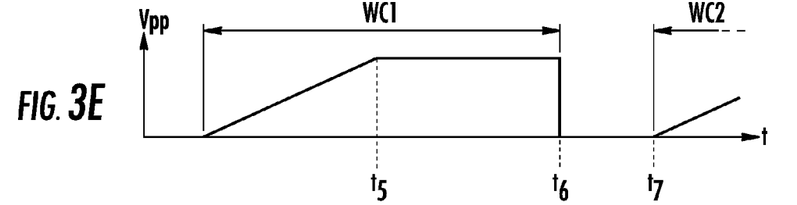

FIGS. 3A to 3E show the aspect of the example signals ON1, WRITE, THR1, the flag THR2 and the voltages Vhv, Vpp during a phase of writing the memory comprising cycles WC1, WC2, . . . of writing in the memory. The signals ON1 and WRITE are shown in FIG. 3A, the voltage Vhv is shown in FIG. 3B (the variations of the voltage Vhv caused by the regulation around the threshold Vc are not shown), the signal THR1 is shown in FIG. 3C (here as detection signal and regulation signal of the voltage Vhv), the flag THR2 is shown in FIG. 3D and the voltage Vpp supplied by the switch circuit SCT as ramp generator is shown in FIG. 3E.

"Write cycle" WC1, WC2 means a cycle of erasing or programming one or more memory cells, "write phase" means a period including all the erase and programming cycles necessary for storing a datum. For example, if the memory MEM is erasable by 8-bit words and programmable by 8-bit words and that the datum to be written is a word, the phase of writing the word comprises a cycle of erasing eight memory cells (collective erase cycle, writing of a 0 in the memory cells) and a cycle of collective programming of memory cells intended to receive a 1. If the memory MEM is page-erasable (word line) or sector-erasable and is programmable by bytes, and if the datum to be written comprises several words belonging to the same sector or to the same page, the phase of writing the words comprises a cycle of collective erasing of the whole sector or of the whole page, and as many programming cycles as words to be written.

At an instant t0 preceding the first write cycle WC1, for example an erase cycle, the signals ON1 and WRITE are at 0, the voltage Vhv is equal to zero, the signal THR1 is equal to 0 and the flag THR2 is kept to 0 by the signal ON1 (acting on the input RESET of the flip-flop FF1). At an instant t1, the control unit CTU2 sets the signal ON1 to 1 and the voltage Vhv starts increasing. At an instant t2, the control unit CTU2 sets the signal WRITE to 1 but the switch circuit SCT remains blocked because the flag THR2 is equal to 0 and inhibits the application of the signal WRITE to a control input of the circuit SCT. At an instant t3, the voltage Vhv reaches the threshold Vc and the signal THR1 goes for the first time to 1 since the booster circuit has been applied voltage, so that the flag THR2 also goes to 1. The circuit SCT triggers itself and a ramp of voltage Vpp is applied to the memory MEM. Simultaneously, the signal ON1 is inhibited at the input of the booster circuit and the high voltage Vhv decreases. At an instant t3', the voltage Vhv goes below the threshold Vc again and the signal THR1 goes back to 0. At an instant t4, the voltage Vhv reaches the threshold Vc and the signal THR1 goes back to 1, then to 0 at an instant t4', etc., these alternations caused by the regulation of the voltage Vhv not affecting the flag THR2 which remains 1 all throughout the write phase, as long as the signal ON1 remains 1. At an instant t5, the voltage Vpp reaches a plateau equal to Vc (or Vc−Vm if the circuit SCT imposes a decrease of voltage Vm to the voltage Vhv) and stays stable around the plateau until an instant t6 which indicates the end of the write cycle WC1, when the unit CTU2 sets the signal WRITE to 0 while letting the signal ON1 to 1. The signal THR1 keeps passing alternately from 0 to 1 and vice-versa to regulate the high voltage Vhv, and the flag THR2 remains 1. At an instant t7, the unit CTU2 sets the signal WRITE back to 1 and the second write cycle WC2 is started, for example a programming cycle. The flag THR2 is here at 1 from the start of the cycle WC2 and remains 1 all throughout the write phase.

Figure 4:
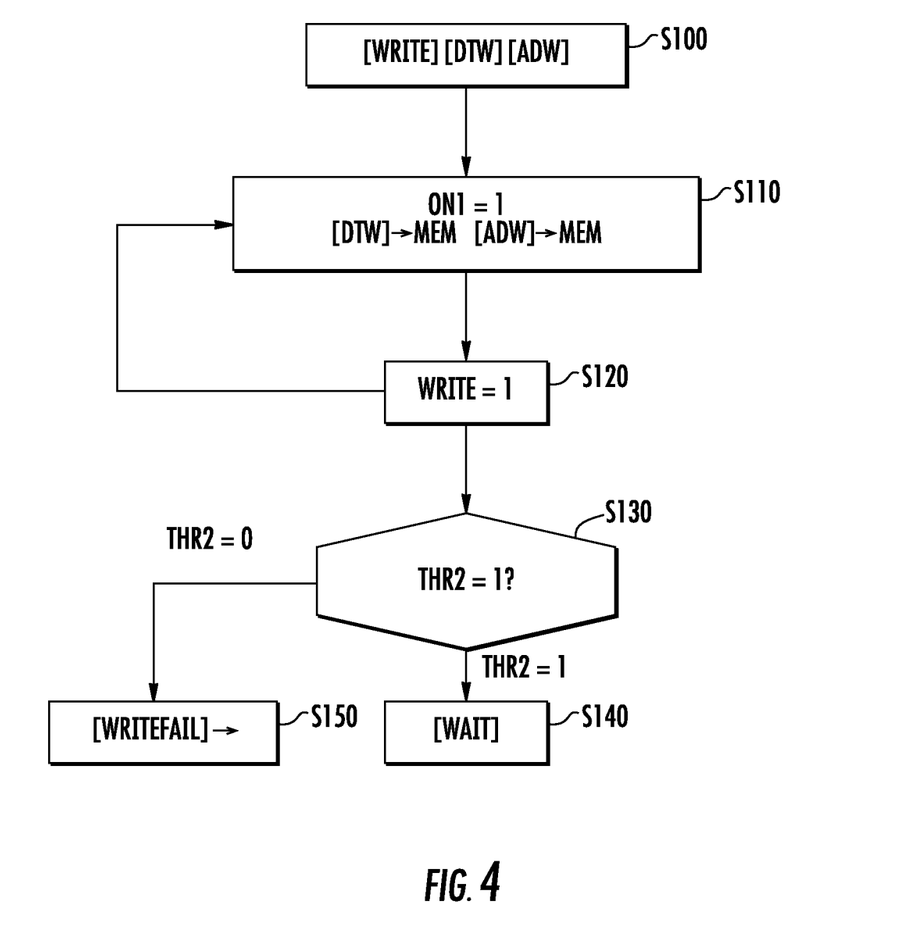
FIG. 4 is a diagram describing operations performed by the integrated circuit of FIG. 1 upon reception of a command for writing in the memory according to one embodiment.

FIG. 4 is a diagram describing the execution of the write phase by the control unit CT2 and the use of the flag THR2 to diagnose a possible fault of the high voltage Vhv, according to an embodiment. During a step S100, the control unit CTU2 receives from the reader RD1 a command "[WRITE][DTW][ADW]". During a step S110, the control unit CTU2 sets the signal ON1 to 1 to activate the booster circuit (instant t1 described above) and applies the datum DTW and the address ADW to the memory. During a step S120, the unit CTU2 sets the signal WRITE to 1 (instant t2 described above). The steps S110 and S120 can be repeated constantly as many times as the number of write cycles CW1, CW2 . . . to be performed, while leaving the signal ON1 to 1.

Once the writing phase is ended, the unit CTU2 tests the flag THR2 during a step S130:

if the flag THR2 is equal to 1, the writing phase is supposed to have occurred normally and the control unit CTU2 jumps to a step S140 ("WAIT") where it waits for a new command. In a variant, the control unit CTU2 reads the data it has written in the memory and sends them back in a message for confirming the execution of the command before jumping to the next step S140, so that the reader RD1 can verify that the data written are actually those contained in the command, if the flag THR2 is equal to 0, it means that the high voltage Vhv has not reached the critical threshold and that the memory has not been written. The control unit CTU2 jumps to a step S150 where it sends a fail message "WRITEFAIL". As previously, the control unit CTU2 may be provided for reading the data in the memory at the read address ADW which appeared in the command, and for sending them back to the reader RD1 with the message WRITEFAIL so that it can verify that corrupted data have not been written. However, an advantage of the flag THR2 according to one embodiment is to allow the integrated circuit to rapidly send a write fail information without it being necessary to read the memory area again, thanks to a reliable fail diagnostic based on the observation of the voltage Vhv and not on the observation of the voltage Vcc.

The use of the indicator flag THR2 for automatically inhibiting the activation of the ramp generator circuit SCT is useful when the integrated circuit IC2 is equipped with a wired-logic control unit CTU comprising a finite state machine which clocks the write cycles according to a fixed sequencing clocked by the clock signal CK. The provision of a wired-logic control unit makes it possible to construct low-cost integrated circuits for mass applications.

However, various embodiments according to the level of "intelligence" and adaptability of the control unit may be provided. For example, a microprocessor control unit can test the flag THHR2 before applying the activation signal WRITE to the switch circuit SCT. In that case, the inhibition of the signal WRITE by means of the flag THR2 is not necessary. The control unit waits until the flag THR2 goes to 1 during a period of time measured by a timer and, if the period of time ends without the voltage Vhv reaching the critical threshold Vc, the control unit cancels the write cycle and sends the message WRITEFAIL.

Figure 5:
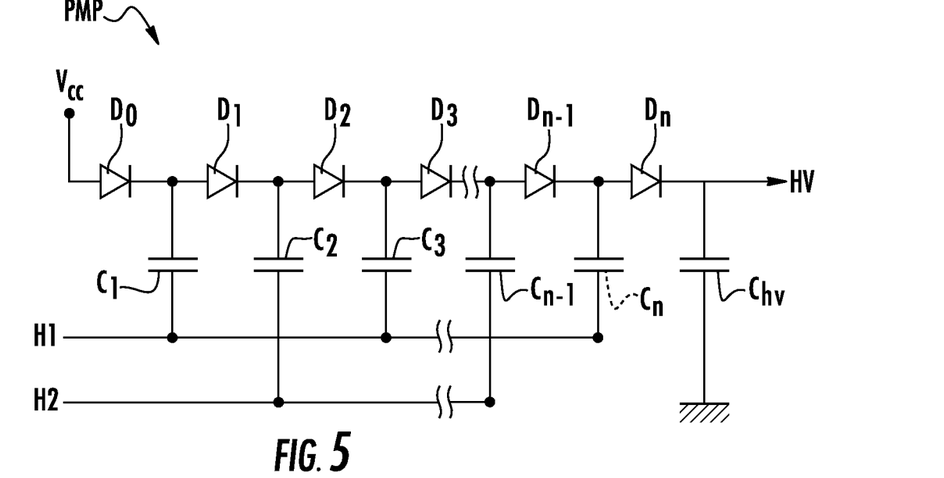
FIG. 5 shows an embodiment of a charge pump represented in block form in FIG. 2.

FIG. 5 shows one embodiment of the charge pump PMP. It comprises capacitors C1, C2 . . . Cn in parallel, the anode of each capacitor being linked to the anode of the capacitor of next rank by a diode D1, D2 . . . Dn−1, the cathode of each capacitor of uneven rank receiving the pump signal H1 and the cathode of each capacitor of even rank receiving the pump signal H2. A diode Dn links the anode of the last capacitor to a capacitor of output Chv supplying the voltage Vhv, and the voltage Vcc is applied to the anode of the first capacitor C1 through a diode D0. When the signal H1 is pulled up and the signal H2 is pulled down, each capacitor of uneven rank discharges in the following capacitor of even rank the charges accumulated during the previous half-cycle where the signal H2 was pulled up and the signal H1 was pulled down. When the signal H2 is pulled up and the signal H1 is pulled down, each capacitor of even rank discharges in the following capacitor of uneven rank the charges accumulated during the previous half-cycle where the signal H1 was pulled up and the signal H2 was pulled down.

Figure 6:
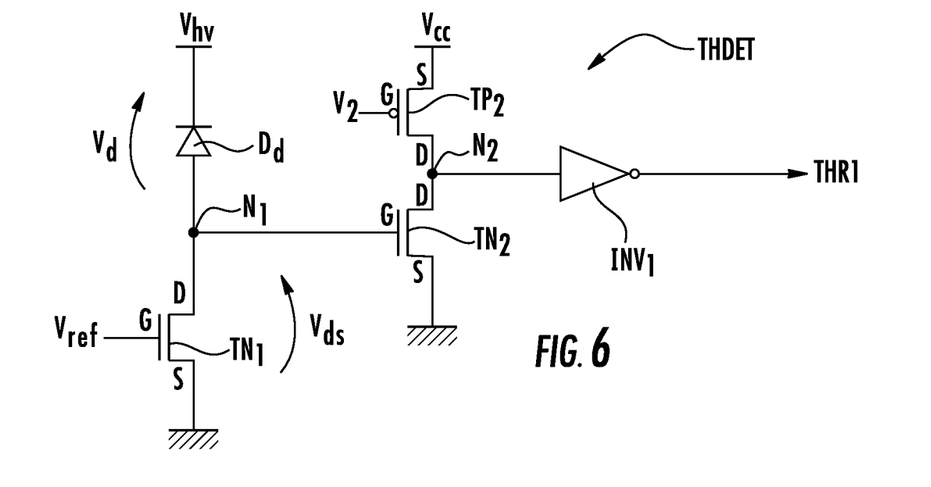
FIG. 6 shows an embodiment of a threshold detector represented in block form in FIG. 2.

FIG. 6 shows an embodiment of the detection circuit THDET. The detection circuit THDET comprises an input stage formed by a diode Dd linked to the drain terminal of a NMOS transistor TN1 whose source terminal is connected to the ground. The diode Dd is inverse-mounted and receives the voltage Vhv. The transistor TN1 receives on its gate G a stable bias voltage Vref, which may be compensated in temperature. The diode Dd has an inverse voltage Vd and the transistor has a drain-source voltage Vds imposed by the voltage Vref. A node N1 located on the drain of the transistor TN1 is applied to the gate of a NMOS transistor TN2 having its source terminal S linked to the ground. The drain terminal D of this transistor forms a node N2 which is applied to the input of an inverting gate INV1 whose output supplies the detection signal THR1. The node N2 is pulled up by a PMOS transistor TP2 whose source terminal S receives the voltage Vcc and whose gate receives a voltage V2. When the voltage Vhv reaches the threshold Vc, here equal to Vd+Vds, the input stage becomes conducting and the node N1 goes from the high impedance potential to the potential Vds. The transistor TN2 becomes conducting and the node N2 goes from 1 (Vcc) to 0 (ground). The signal THR1 goes to 1.

Figure 7:
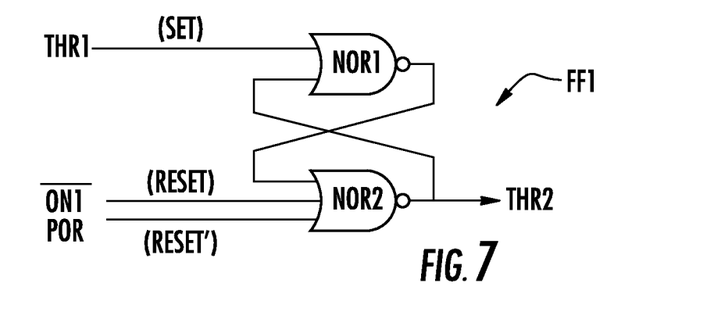
FIG. 7 shows an embodiment of a volatile memory point represented in block form in FIG. 2, receiving an indicator flag according to one embodiment.

FIG. 7 shows an embodiment of the flip-flop FF1 by means of two gates NOR1, NOR2 (NOR gates), each gate having its output linked to an input of the other gate. Another input of the gate NOR1 forms the input SET of the flip-flop and receives the signal THR1. Another input of the gate NOR2 forms the input RESET of the flip-flop and receives the signal /ON1, as described above. The output of the gate NOR2 supplies the flag THR2. Optionally, the gate NOR2 comprises a third input forming an input RESET' of the flip-flop and receiving a POR signal ("Power On Reset") which is generated by the integrated circuit at each powering on.

Figure 8:
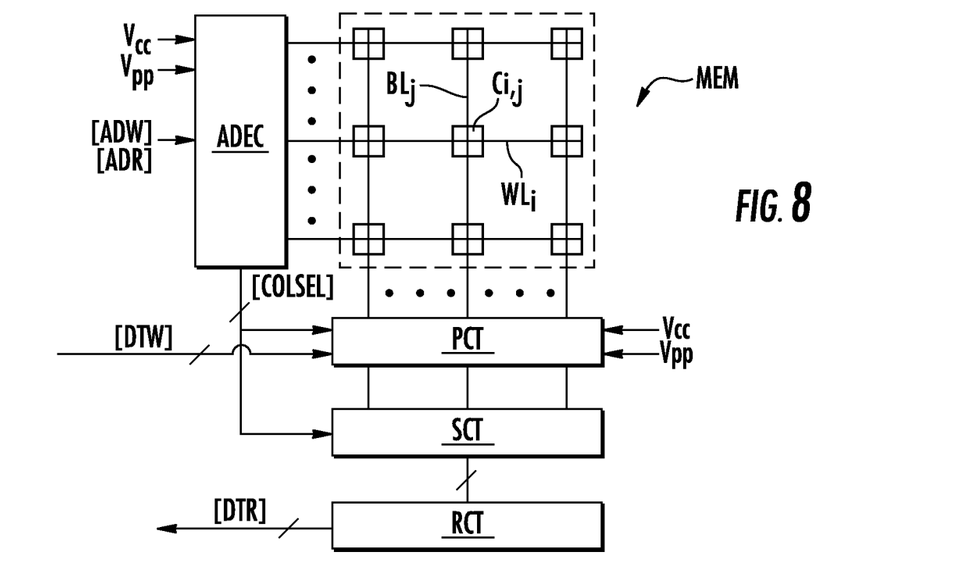
FIG. 8 shows an embodiment of a non-volatile memory represented in block form in FIG. 2.

FIG. 8 schematically shows an embodiment of the memory MEM. The memory MEM comprises a memory array MA, an address decoder ADEC, a programming circuit PCT, a selection circuit SCT and a read circuit RCT. The memory array MA comprises electrically erasable and programmable memory cells Ci,j arranged according to horizontal and vertical lines and linked to word lines WLi and to bit lines BLj. The programming circuit PCT comprises erase-programming locks (not shown) linked to the bit lines of the memory array, selected by a signal COLSEL supplied by the decoder ADEC and receiving the data DTW to be written in the memory array. The read circuit RCT comprises one or more sense amplifiers linked to the bit lines of the memory array MA through the selection circuit SCT and supplying the data DTR read in the memory array.

Figure 9:
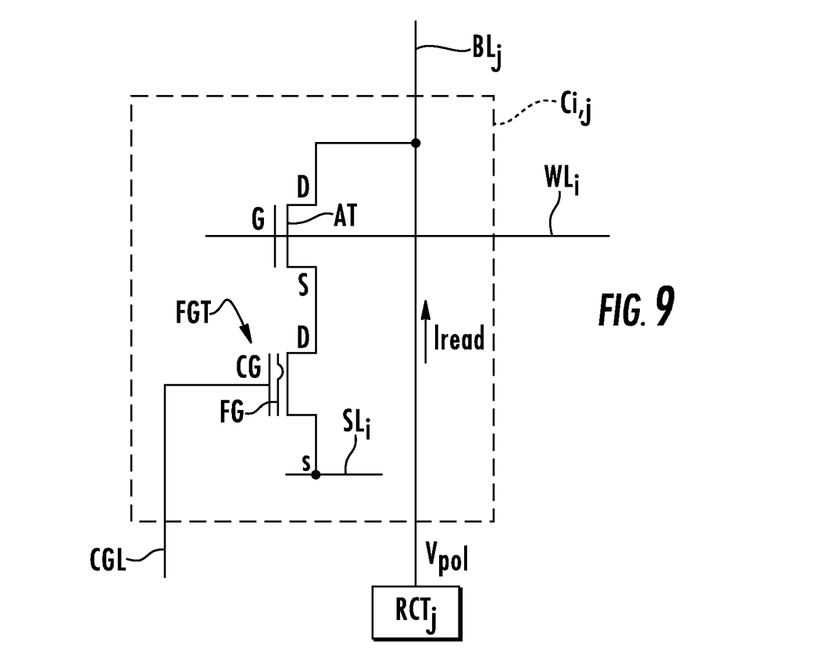
FIG. 9 shows an embodiment of a non-volatile memory cell present in the memory of FIG. 8.

FIG. 9 shows an embodiment of an electrically erasable and programmable memory cell Ci,j allowing a bit bi,j to be stored in the memory array. The memory cell comprises a floating gate transistor FGT and an access transistor AT, here of the type NMOS. The access transistor has a drain terminal D connected to a bit line BLj, a gate G connected to a word line WLi and a source terminal S connected to a drain terminal D of the transistor FGT. The latter further comprises a floating gate FG, a control gate CG linked to a control gate line CGL, and a source terminal S linked to a source line SLi. The memory cell Ci,j is set in the programmed state by applying for example the voltage Vpp on the drain terminal D of the transistor FGT, via the access transistor AT, and a voltage of lower value, for example 0V, on its control gate CG. Electric charges are injected into the floating gate FG by tunneling effect and lower the threshold voltage Vt of the transistor FGT, which generally becomes negative. The memory cell Ci,j is set in the erased state by applying for example the voltage Vpp on the control gate CG of the transistor FGT and a voltage of lower value, for example 0V, on its source terminal S. Electric charges are extracted from the floating gate FG by tunneling effect and the threshold voltage of the transistor FGT increases to generally become positive.

The reading of the memory cell Ci,j is ensured by a sense amplifier RCTj linked to the drain terminal D of the transistor FGT via the bit line BLj and the access transistor AT. The amplifier RCTj applies to the bit line a bias voltage Vpol while a read voltage Vread is applied to the control gate CG of the transistor FGT and that the source line is put to the ground. If the transistor FGT is in the programmed state, the memory cell is conducting and a read current Iread superior to a determined threshold flows through the bit line BLj. The amplifier RCTj then supplies a bit bi,j whose value is defined by convention, for example 1. If the transistor FGT is in the erased state, the memory cell is not conducting or slightly conducting and the amplifier RCTj supplies a bit bi,j of reverse value, for example a bit equal to 0.

The use of this memory EEPROM having cells electrically erasable and programmable by tunneling effect is advantageous because the injection and the extraction of charges by tunneling effect are performed with a very low current, unlike the memories in which the injection of charges is performed by the injection of hot carriers and require a significant cell current. This memory thus satisfies a basic principle of an embodiment, according to which the writing process may generally properly develop even in presence of an attenuation of the voltage Vhv, as soon as the critical threshold Vc is reached. In practice, and as it emerges from above, the threshold Vc is preferably chosen equal to or near the regulation threshold of the booster circuit, which is usually about 10 to 15 V according to the technology used to make these memory cells.

The means for monitoring the high voltage Vhv and for managing the indicator flag THR2 are susceptible to various embodiments. The various embodiments are also susceptible of several applications and are not only intended to the contactless UHF circuits operating by electric coupling. One embodiment applies for example to integrated circuits using inductive coupling and globally applies to any integrated circuit or transponder which power supply is susceptible of failing during phases of programming or erasing memory cells.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A passive contactless integrated circuit, comprising:
   an electrically programmable non-volatile data memory;
   a charge accumulation booster circuit to supply a high voltage sufficient to write data in the memory;
   a volatile memory cell to store an indicator flag;
   means for modifying the indicator flag when the high voltage reaches a threshold for a first time after activating the booster circuit; and
   a switch circuit coupled between the charge accumulation booster circuit and the non-volatile data memory to apply the high voltage to the non-volatile data memory as long as the high voltage has reached the threshold at least once after activating the charge accumulation booster circuits.

2. The integrated circuit according to claim 1, further comprising means for preventing the switch circuit from applying the high voltage to the memory as long as the high voltage has not reached the threshold after activating the booster circuit.

3. The integrated circuit according to claim 1 wherein the switch circuit includes a ramp generator to progressively supply the high voltage to the memory.

4. The integrated circuit according to claim 1, further comprising a control unit configured to execute a command to write a datum in the memory and then to send a specific message of information when the flag indicates that the high voltage has not reached the threshold during execution of the write command.

5. The integrated circuit according to claim 1, further comprising a control unit configured to unconditionally perform, in response to a command to write a datum in the memory:
   apply an activation signal to the booster circuit so that said booster circuit produces the high voltage;
   apply to the memory a write address and a datum to be written; and
   apply an activation signal to a switch circuit adapted to supply the high voltage to the memory.

6. The integrated circuit according to claim 1, further comprising a control unit configured to perform, upon reception of a command to write a datum in the memory:
   apply an activation signal to the booster circuit, so that said booster circuit produces the high voltage;
   apply to the memory a write address and the datum to be written;
   if the high voltage reaches the threshold, apply an activation signal to a switch circuit adapted to supply the high voltage to the memory; and
   if the high voltage has not reached the threshold at an end of a period of time, not apply the activation signal to the switch circuit and send a specific message of information indicating that the high voltage has not been applied to the memory.

7. The integrated circuit according to claim 1 wherein said means for modifying includes a detection circuit which monitors the high voltage and supplies a detection signal having a value that indicates if the high voltage is lower than the threshold or is superior or equal to the threshold.

8. The integrated circuit according to claim 1 wherein said means for modifying includes a regulator circuit supplying a regulation signal of the booster circuit having an active value each time the high voltage is superior or equal to a regulation threshold.

9. The integrated circuit according to claim 8 wherein the threshold is equal to the regulation threshold.

10. The integrated circuit according to claim 8 wherein said means for modifying includes a detection circuit which monitors the high voltage and supplies a detection signal having a value that indicates if the high voltage is lower than the threshold or is superior or equal to the threshold, wherein the regulation signal and the detection signal are same.

11. The integrated circuit according to claim 1 wherein the volatile memory cell includes a flip-flop having a first control input terminal to give the flag a first value meaning that the high voltage has reached the threshold, and a second control input terminal to give the flag a second value meaning that the high voltage has not reached the threshold.

12. The integrated circuit according to claim 11 wherein said means for modifying includes a detection circuit which monitors the high voltage and supplies a detection signal having a value that indicates if the high voltage is lower than the threshold or is superior or equal to the threshold, wherein the first control input terminal of the flip-flop receives the detection signal.

13. The integrated circuit according to claim 11 wherein the second input terminal of the flip-flop receives at least one of two signals: a signal to deactivate the booster circuit and a signal to reset the integrated circuit.

14. The integrated circuit according to claim 1, further comprising a charge pump adapted to receive a voltage signal from an antenna and to produce a supply voltage by boosting the voltage signal, wherein the charge accumulation booster circuit is adapted to create the high voltage by boosting the supply voltage.

15. A portable electronic object, comprising:
   a portable support and an integrated circuit carried thereby, the integrated circuit including an electrically programmable non-volatile data memory;
   a charge accumulation booster circuit coupled to said memory to supply a high voltage sufficient to write data in the memory;
   a volatile memory cell to store an indicator flag;
   circuitry to modify the indicator flag when the high voltage reaches a threshold for a first time after activation of the booster circuit; and a switch circuit coupled between the charge accumulation booster circuit and the non-volatile data memory to apply the high voltage to the non-volatile data memory as long as the high voltage has reached the threshold at least once after activating the charge accumulation booster circuit.

16. The portable electronic object according to claim 15 wherein the integrated circuit includes a control unit adapted to execute a command to write a datum in the memory and then to send a specific message of information when the flag indicates that the high voltage has not reached the threshold during execution of the write command.

17. The portable electronic object according to claim 15 wherein the integrated circuit includes a control unit configured to unconditionally perform, in response to a command to write a datum in the memory:
   apply an activation signal to the booster circuit so that said booster circuit produces the high voltage;
   apply to the memory a write address and a datum to be written; and
   apply an activation signal to a switch circuit adapted to supply the high voltage to the memory.

18. The portable electronic object according to claim 15 wherein the integrated circuit includes a control unit configured to perform, upon reception of a command to write a datum in the memory:
   apply an activation signal to the booster circuit, so that said booster circuit produces the high voltage;
   apply to the memory a write address and the datum to be written;
   if the high voltage reaches the threshold, apply an activation signal to a switch circuit adapted to supply the high voltage to the memory; and
   if the high voltage has not reached the threshold at an end of period of time, not apply the activation signal to the switch circuit and send a specific message of information indicating that the high voltage has not been applied to the memory.

19. The portable electronic object according to claim 15 wherein the volatile memory cell includes a flip-flop having a first control input terminal to give the flag a first value meaning that the high voltage has reached the threshold, and a second control input terminal to give the flag a second value meaning that the high voltage has not reached the threshold.

20. A method for writing a datum in an electrically programmable non-volatile memory of a passive contactless integrated circuit, the method comprising:
   initializing an indicator flag in a volatile memory cell of the integrated circuit;
   activating a charge accumulation booster circuit supplying a high voltage sufficient to write the datum in the memory;
   changing the indicator flag if the high voltage reaches a threshold for a first time after activating the booster circuit; and
   activating a switch circuit coupled between the charge accumulation booster circuit and the non-volatile memory to apply the high voltage to the non-volatile memory as long as the high voltage has reached the threshold at least once after activating the booster circuit.

21. The method according to claim 20, further comprising unconditionally executing stages aimed at writing the datum in the memory, and then sending a message of information concerning the indicator flag if the flag indicates that the high voltage has not reached the threshold during execution of the stages.

22. The method according to claim 20, further comprising regulating the high voltage around a regulation threshold.

23. The method according to claim 22 wherein the threshold is equal to the regulation threshold.

24. The method according to claim 22 wherein the indicator flag is managed by a flip-flop having a control input terminal to which a detection signal is applied having a value that indicates whether the high voltage is inferior to the threshold or is superior or equal to the threshold.

25. The method according to claim 24 wherein the flip-flop is reset when the booster circuit is not active.

* * * * *